US010304972B2

(12) United States Patent
Shepherd et al.

(10) Patent No.: US 10,304,972 B2
(45) Date of Patent: *May 28, 2019

(54) SOLAR CELL WITH SILICON OXYNITRIDE DIELECTRIC LAYER

(71) Applicant: SUNPOWER CORPORATION, San Jose, CA (US)

(72) Inventors: Michael Shepherd, San Jose, CA (US); David D. Smith, Campbell, CA (US)

(73) Assignee: SunPower Corporation, San Jose, CA (US)

(*) Notice: Subject to any disclaimer, the term of this patent is extended or adjusted under 35 U.S.C. 154(b) by 218 days.

This patent is subject to a terminal disclaimer.

(21) Appl. No.: 14/664,759

(22) Filed: Mar. 20, 2015

(65) Prior Publication Data
US 2015/0194539 A1 Jul. 9, 2015

Related U.S. Application Data

(63) Continuation of application No. 13/720,417, filed on Dec. 19, 2012, now Pat. No. 9,018,516.

(51) Int. Cl.
H01L 31/0216 (2014.01)
H01L 31/02 (2006.01)
(Continued)

(52) U.S. Cl.
CPC ........ *H01L 31/02* (2013.01); *H01L 31/02002* (2013.01); *H01L 31/0236* (2013.01);
(Continued)

(58) Field of Classification Search
CPC ......... H01L 31/022441; H01L 31/0682; Y02E 10/50–10/58
(Continued)

(56) References Cited

U.S. PATENT DOCUMENTS 7,812,250 B2   10/2010   Smith
9,018,516 B2 * 4/2015   Shepherd ............ H01L 31/0236
                                                  136/255
(Continued)

FOREIGN PATENT DOCUMENTS

CN   101558482   4/2006
CN   101305472   11/2008
(Continued)

OTHER PUBLICATIONS

FAI Office Action from U.S. Appl. No. 13/720,417 dated Aug. 28, 2014, 5 pgs.
(Continued)

Primary Examiner — Susan D Leong
Assistant Examiner — Dujuan A Horton
(74) Attorney, Agent, or Firm — Schwabe, Williamson & Wyatt, P.C.

(57) ABSTRACT

Solar cells with silicon oxynitride dielectric layers and methods of forming silicon oxynitride dielectric layers for solar cell fabrication are described. For example, an emitter region of a solar cell includes a portion of a substrate having a back surface opposite a light receiving surface. A silicon oxynitride ($SiO_xN_y$, $0<x, y$) dielectric layer is disposed on the back surface of the portion of the substrate. A semiconductor layer is disposed on the silicon oxynitride dielectric layer.

11 Claims, 3 Drawing Sheets

(51) Int. Cl.
*H01L 31/0236* (2006.01)
*H01L 31/0224* (2006.01)
*H01L 31/0368* (2006.01)
*H01L 31/068* (2012.01)
*H01L 31/18* (2006.01)

(52) U.S. Cl.
CPC .. *H01L 31/02167* (2013.01); *H01L 31/02245* (2013.01); *H01L 31/02363* (2013.01); *H01L 31/03682* (2013.01); *H01L 31/0682* (2013.01); *H01L 31/18* (2013.01); *H01L 31/1804* (2013.01); *Y02E 10/50* (2013.01); *Y02E 10/546* (2013.01); *Y02E 10/547* (2013.01); *Y02P 70/521* (2015.11)

(58) Field of Classification Search
USPC .................................................. 136/243–265
See application file for complete search history.

(56) References Cited

U.S. PATENT DOCUMENTS

| | | | |
|---|---|---|---|
| 2007/0175508 A1 | 8/2007 | Hyun | |
| 2009/0277782 A1* | 11/2009 | Theodore | H01S 3/02 204/192.15 |
| 2009/0314341 A1* | 12/2009 | Borden | H01L 31/022441 136/256 |
| 2011/0162706 A1 | 7/2011 | Borden et al. | |
| 2012/0138135 A1 | 6/2012 | Manning | |

FOREIGN PATENT DOCUMENTS

| | | |
|---|---|---|
| CN | 101652865 | 2/2010 |
| CN | 101681944 | 3/2010 |
| CN | 101999175 | 3/2011 |
| CN | 101999176 | 3/2011 |
| CN | 102263157 | 11/2011 |
| JP | 2008124523 A | 5/2008 |
| JP | 2011517119 A | 5/2011 |
| KR | 10-2009-0129507 | 12/2009 |
| KR | 10-2010-0019522 | 2/2010 |
| WO | WO-2006/124131 | 11/2006 |
| WO | WO-2009/094578 | 7/2009 |
| WO | WO-2009/126796 | 10/2009 |
| WO | WO-2009/126803 | 10/2009 |

OTHER PUBLICATIONS

Office Action for Chinese Patent Application No. 201380068130.2, dated Jul. 15, 2016 17 pgs.
International Preliminary Report on Patentability from PCT/US2013/072104 dated Jul. 2, 2015, 7 pgs.
International Search Report and Written Opinion of the International Searching Authority dated Mar. 10, 2014, in International Patent Application No. PCT/US2013/072104.
Non-Final Office Action for Australian Patent Application No. 2013363640 dated Feb. 15, 2017, 4 pgs.
Notice of First Office Action from Japanese Patent Application No. 2015-549420 dated Nov. 7, 2017, 5 pgs.

\* cited by examiner

US 10,304,972 B2

SOLAR CELL WITH SILICON OXYNITRIDE DIELECTRIC LAYER

CROSS-REFERENCE TO RELATED APPLICATIONS

This application is a continuation of U.S. patent application Ser. No. 13/720,417, filed on Dec. 19, 2012, the entire contents of which are hereby incorporated by reference herein.

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, solar cells with silicon oxynitride dielectric layers.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present invention allow for increased solar cell manufacture efficiency by providing novel processes for fabricating solar cell structures. Some embodiments of the present invention allow for increased solar cell efficiency by providing novel solar cell structures.

DETAILED DESCRIPTION

Figure 1:
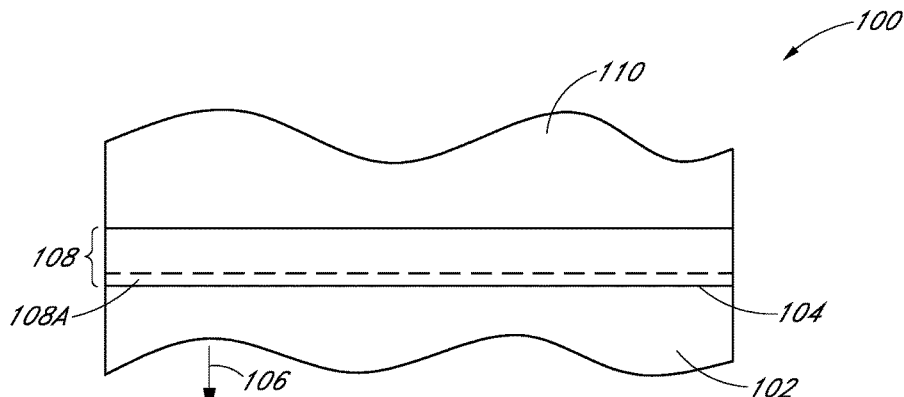
FIG. 1 is a cross-sectional view illustrating an emitter region of a solar cell, in accordance with an embodiment of the present invention.

Solar cells with silicon oxynitride dielectric layers and methods of forming silicon oxynitride dielectric layers for solar cell fabrication are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithography and patterning techniques, are not described in detail in order to not unnecessarily obscure embodiments of the present invention. Furthermore, it is to be understood that the various embodiments shown in the figures are illustrative representations and are not necessarily drawn to scale.

Disclosed herein are solar cells and, in particular, emitter regions for solar cells. In an embodiment, an emitter region of a solar cell includes a portion of a substrate having a back surface opposite a light receiving surface. A silicon oxynitride ($SiO_xN_y$, 0<x, y) dielectric layer is disposed on the back surface of the portion of the substrate. A semiconductor layer is disposed on the silicon oxynitride dielectric layer. In another embodiment, a solar cell includes a first emitter region. The first emitter region includes a first portion of a substrate having a back surface opposite a light receiving surface. A silicon oxynitride ($SiO_xN_y$, 0<x, y) dielectric layer is disposed on the back surface of the first portion of the substrate. A P-type semiconductor layer is disposed on the silicon oxynitride dielectric layer. The solar cell also includes a second emitter region. The second emitter region includes a second portion of the substrate. The silicon oxynitride dielectric layer is disposed on the back surface of the second portion of the substrate. An N-type semiconductor layer is disposed on the silicon oxynitride dielectric layer. In another embodiment, an emitter region of a solar cell includes a portion of an N-type bulk silicon substrate having a back surface opposite a light receiving surface. A silicon oxynitride ($SiO_xN_y$, 0<x, y) dielectric layer is disposed on the back surface of the portion of the N-type bulk silicon substrate. The silicon oxynitride dielectric layer has a non-homogeneous distribution of nitrogen. A boron-doped polycrystalline silicon layer is disposed on the silicon oxynitride dielectric layer. A metal contact is disposed on the P-type polycrystalline silicon layer.

Also disclosed herein are methods of fabricating solar cells and, in particular, methods of forming emitter regions for solar cells. In an embodiment, a method of fabricating an emitter region of a solar cell includes forming a silicon oxynitride ($SiO_xN_y$, 0<x, y) dielectric layer on a surface of a bulk N-type silicon substrate of the solar cell by consuming a portion of the N-type silicon substrate. The method also includes forming a semiconductor layer on the silicon oxynitride dielectric layer.

One or more embodiments described herein are directed to processes for fabricating tunnel dielectric with silicon oxynitride materials. In one such embodiment, a silicon oxynitride tunnel dielectric is used between a silicon substrate and a polysilicon emitter layer. Such an oxynitride tunnel layer may be used in place of a more conventional thermal silicon dioxide layer tunnel dielectric. In an embodiment, use of the oxynitride dielectric layers described herein may be used to prevent boron penetration through the tunnel dielectric (e.g., during high temperature processing) which otherwise may degrade surface passivation of a P-type polysilicon based emitter in cells having conventional (non-nitrided) tunnel dielectric layers. In one such embodiment, use of an oxynitride presents an improved barrier to boron diffusion versus a nitrogen-free oxide material layer.

In an embodiment, a silicon oxynitride layer is grown in a fashion similar to thermal oxidation, but using gases that allow nitrogen incorporation into the resulting layer. Nitrogen concentration, growth rate, layer thickness and uniformity can be varied using gas composition, temperature, and pressure. In an embodiment, a silicon oxynitride layer is formed on a silicon substrate in a low pressure chemical vapor deposition (LPCVD) furnace, but can instead be formed in a plasma enhanced chemical vapor deposition (PECVD) chamber. As described in greater detail below, one or more embodiments involves forming a tunnel dielectric for a poly emitter solar cell by using a thermal process based on one or more of nitric oxide (NO), nitrous oxide ($N_2O$), ammonia ($NH_3$) and/or oxygen ($O_2$), or other gases or combinations of gases containing oxygen and/or nitrogen. Specific embodiments include forming an oxynitride film that has a nitrogen concentration that varies with depth, e.g., an oxide layer that has nitrogen incorporated near a surface or interface, or graded throughout the layer.

Figure 2:
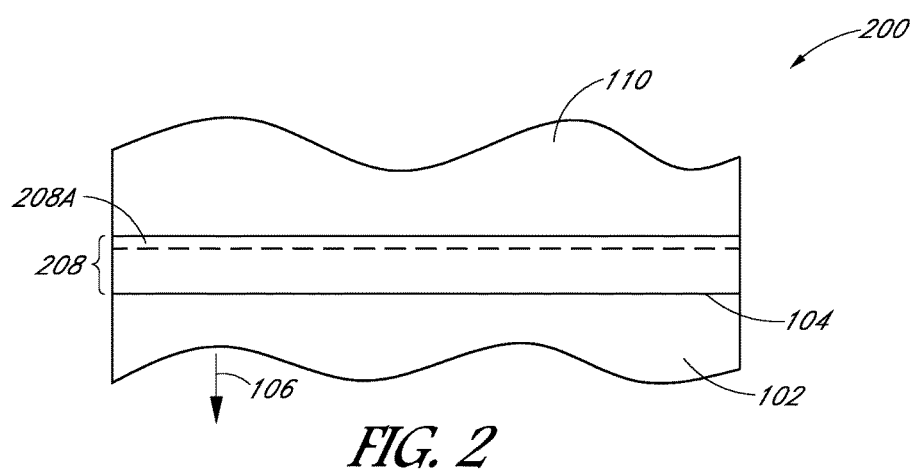
FIG. 2 is a cross-sectional view illustrating another emitter region of a solar cell, in accordance with another embodiment of the present invention.
Figure 3:
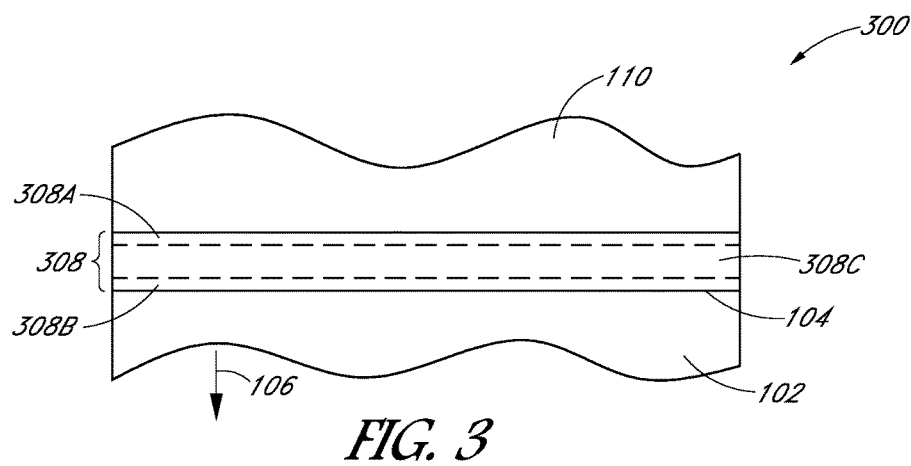
FIG. 3 is a cross-sectional view illustrating another emitter region of a solar cell, in accordance with yet another embodiment of the present invention.

As examples of emitter regions having silicon oxynitride tunnel dielectric layers, FIGS. 1-3 illustrate cross-sectional views of emitter regions for inclusion in a solar cell, in accordance with three different embodiments of the present invention. Referring to FIGS. 1-3, an emitter region 100, 200 or 300 of a solar cell includes a portion of a substrate 102 (e.g., an N-type bulk crystalline silicon substrate) having a back surface 104 opposite a light receiving surface (not shown, but direction provided by arrow 106). A silicon oxynitride ($SiO_xN_y$, 0<x, y) dielectric layer 108, 208 or 308, respectively, is disposed on the back surface 106 of the portion of the substrate 102. A semiconductor layer 110 is disposed on the silicon oxynitride dielectric layer 108, 208 or 308, only a portion of which is depicted in FIGS. 1-3.

Referring again to FIGS. 1-3, in an embodiment, the silicon oxynitride dielectric layers 108, 208 and 308 have a non-homogeneous distribution of nitrogen throughout. For example, a silicon oxynitride dielectric layer may have one region or maxima of nitrogen concentration. In a first specific embodiment, referring to FIG. 1, the silicon oxynitride dielectric layer 108 has only one nitrogen concentration maxima (shown as region 108A). The maxima 108A is at a surface of the silicon oxynitride dielectric layer 108 proximate to the back surface 106 of the portion of the substrate 102. In a second specific example, referring to FIG. 2, the silicon oxynitride dielectric layer 208 also has only one nitrogen concentration maxima (shown as region 208A). However, the maxima 208A is at a surface of the silicon oxynitride dielectric layer 208 distal from the back surface 106 of the portion of the substrate 102, i.e., proximate to layer 110.

In another example, a silicon oxynitride dielectric layer may have more than one region or maxima of nitrogen concentration. In a specific embodiment, referring to FIG. 3, the silicon oxynitride dielectric layer 308 has two nitrogen concentration maxima (shown as regions 308A and 308B), one maxima 308A at a surface of the silicon oxynitride dielectric layer 308 distal from the back surface 106 of the portion of the substrate 102, and one maxima 308B at a surface of the silicon oxynitride dielectric layer 308 proximate to the back surface 106 of the portion of the substrate 102. In a particular such embodiment, the distance between the maxima 308A and 308B is approximately in the range of 5-6 Angstroms.

Whether only nitrogen maxima region or more than one maxima region, it is to be understood that the remainder of the oxynitride film need not be nitrogen-free. In an exemplar embodiment, regions of high nitrogen concentration (such as maxima 108A, 208A, 308A and 308B) have a nitrogen concentration accounting for approximately 2-5% of the total atomic concentration with the film in that region (the other components including silicon and oxygen). Meanwhile, the regions of the films outside of the maxima are regions of relatively low nitrogen concentration accounting for approximately 0-1% of the total atomic concentration with the film in that region (the other components also including silicon and oxygen).

Referring again to FIGS. 1-3, in an embodiment, the silicon oxynitride dielectric layers 108, 208 or 308 have a total thickness approximately in the range of 10-20 Angstroms. In one such embodiment, referring specifically to FIG. 3, the silicon oxynitride dielectric layer 308 has a first nitrogen-rich region (308B) having a thickness approximately in the range of 4-5 Angstroms, a nitrogen-poor region 308C disposed above the first nitrogen-rich region 308B and having a thickness approximately in the range of 5-6 Angstroms, and a second nitrogen-rich region 308A disposed above the nitrogen-poor region 308C and having a thickness approximately in the range of 4-5 Angstroms. In an embodiment, considering total film atomic concentration, the silicon oxynitride dielectric layers 108, 208 and 308 are composed of a greater amount of oxygen than nitrogen, i.e., for $SiO_xN_y$, x>y.

As mentioned above, the role of nitrogen in a tunnel dielectric layer of an emitter region of a solar cell may be to prevent or at least inhibit dopant penetration through the tunnel dielectric layer and into an underlying substrate. For example, in an embodiment, referring again to FIGS. 1-3, the semiconductor layer 110 disposed on the silicon oxynitride dielectric layers 108, 208 or 308 is a boron-doped silicon layer, e.g., a P-type layer. In one such embodiment, as a result of doping into or diffusing from the boron-doped silicon layer, the silicon oxynitride dielectric layer 108, 208 or 308 includes at least some boron atoms. However, in a specific such embodiment, although the layer 108, 208 or 308 may ultimately include some P-type (or other) dopants, the silicon oxynitride dielectric layer 108, 208 or 308 inhibits dopant penetration from the semiconductor layer 110 to the portion of the substrate 102.

Although only emitter regions are depicted in FIGS. 1-3, it is to be understood that the structures 100, 200 or 300 can further include a metal contact disposed on the semiconductor layer 100, as described below in association with FIG. 4C. In one such embodiment, the emitter regions 100, 200 or 300 are for inclusion in a back contact solar cell with emitter layer (e.g., semiconductor layer 110) formed outside of substrate 102.

In another aspect, a method of fabricating a solar cell may include forming a silicon oxynitride dielectric layer on a substrate surface prior to forming an overlying semiconductor layer. The substrate, dielectric layer and overlying semiconductor layer can ultimately be used as an emitter region of the solar cell. In an example, FIGS. 4A-4C illustrate cross-sectional views of various processing operations in a method of fabricating a solar cell 450, in accordance with an embodiment of the present invention.

Figure 4A:
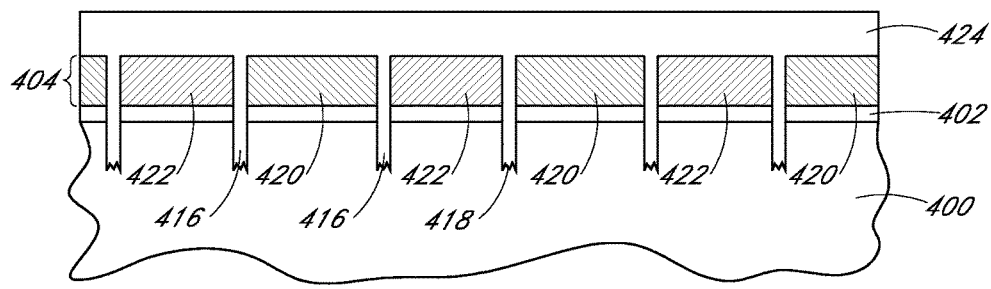
FIGS. 4A-4C illustrate cross-sectional views of various processing operations in a method of fabricating a solar cell, in accordance with an embodiment of the present invention.
Figure 4B:
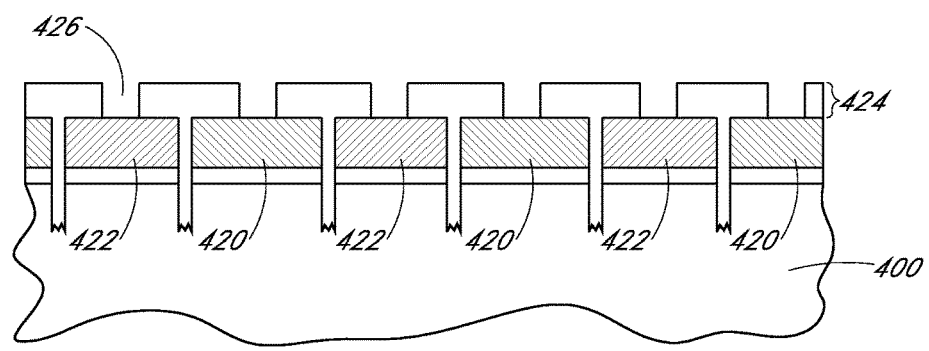

Referring to FIG. 4A, a method of fabricating an emitter region of a solar cell includes forming a silicon oxynitride ($SiO_xN_y$, 0<x, y) dielectric layer 402 on a surface of a substrate 402, e.g., on a surface of a bulk N-type silicon substrate of the solar cell. In some embodiments, the silicon substrate 400 is cleaned, polished, planarized, and/or thinned or otherwise processed prior to the formation of the silicon oxynitride dielectric layer 402. In an embodiment, the silicon oxynitride dielectric layer 402 is formed in a low pressure chemical vapor deposition (LPCVD) chamber. In an embodiment, the silicon oxynitride dielectric layer 402 is formed by consuming a portion of an N-type silicon substrate. For example, in one such embodiment, the silicon oxynitride dielectric layer 402 is formed by oxidizing and nitridizing a portion of an N-type silicon substrate. In a specific such embodiment, the oxidizing and nitridizing forms a non-homogeneous distribution of nitrogen in the silicon oxynitride dielectric layer 402, as described in association with layers 108, 208 and 308 of FIGS. 1-3, respectively.

In a particular exemplary embodiment, the oxidizing and nitridizing includes heating, in the presence of oxygen ($O_2$) and nitric oxide (NO), an N-type silicon substrate 400 to a temperature approximately in the range of 650-900 degrees Celsius without a plasma or to a temperature approximately in the range of 200-350 degrees Celsius with a plasma to form the silicon oxynitride dielectric layer 402 having only one nitrogen concentration maxima, the maxima at a surface of the silicon oxynitride dielectric layer 402 proximate to the N-type silicon substrate 400. This may be performed by first flowing predominantly the oxygen source and later flowing nitric oxide which nitridizes at the bottom of the resulting film. As an example, the silicon oxynitride layer in this embodiment may be as described in association with silicon oxynitride layer 108 of FIG. 1.

In another particular exemplary embodiment, the oxidizing and nitridizing includes heating, in the presence of oxygen ($O_2$) and nitric oxide (NO), an N-type silicon substrate to a temperature approximately in the range of 650-900 degrees Celsius without a plasma or to a temperature approximately in the range of 200-350 degrees Celsius with a plasma to form the silicon oxynitride dielectric layer 402 having only one nitrogen concentration maxima, the maxima at a surface of the silicon oxynitride dielectric layer 402 distal from the N-type silicon substrate 400. This may be performed by first flowing predominantly the oxygen source in combination with nitric oxide, and later flowing predominantly the oxygen source only. As an example, the silicon oxynitride layer in this embodiment may be as described in association with silicon oxynitride layer 208 of FIG. 2.

In yet another particular exemplary embodiment, the oxidizing and nitridizing includes heating, in the presence of oxygen ($O_2$) and nitric oxide (NO), an N-type silicon substrate to a temperature approximately in the range of 650-900 degrees Celsius without a plasma or to a temperature approximately in the range of 200-350 degrees Celsius with a plasma to form the silicon oxynitride dielectric layer 402 having two nitrogen concentration maxima, one maxima at a surface of the silicon oxynitride dielectric layer 402 distal from the N-type silicon substrate 400, and one maxima at a surface of the silicon oxynitride dielectric layer 402 proximate to the N-type silicon substrate 400. In one such embodiment, the nitridizing and oxidizing includes first flowing nitric oxide (NO) and oxygen ($O_2$), next flowing only oxygen ($O_2$), and finally flowing nitric oxide (NO) and oxygen ($O_2$) to form the silicon oxynitride dielectric layer 402. As an example, the silicon oxynitride layer in this embodiment may be as described in association with silicon oxynitride layer 308 of FIG. 3.

Referring again to FIG. 4A, the method of fabricating the emitter region of a solar cell further includes forming a semiconductor layer 404 on the silicon oxynitride dielectric layer 402. In an embodiment, the semiconductor layer is a polysilicon layer and, subsequent to (or during) formation is used to form a plurality of N-type doped polysilicon regions 420 and a plurality of P-type doped polysilicon regions 422, as depicted in FIG. 4A. Additionally, trenches 416 can be formed between regions 420 and 422. A texturized surface 418 can be formed at the bottom of each of the trenches 416. Both the trenches 416 and texturized surfaces 418 are depicted in FIG. 4A.

Thus, in an embodiment, a solar cell is fabricated to includes first emitter regions and second emitter regions, e.g., based on the plurality of N-type doped polysilicon regions 420 and a plurality of P-type doped polysilicon regions 422, respectively. The emitter regions based on P-type doped polysilicon regions 422, in one embodiment, include boron dopant impurity atoms that are included either in situ or subsequent to formation of the semiconductor layer 404. In one such embodiment, the nitrogen included in the silicon oxynitride dielectric layer 402 is provided for inhibiting dopant penetration from the P-type semiconductor layers 422 to the substrate 400. Furthermore, in an embodiment, the silicon oxynitride dielectric layer 402 is a silicon oxynitride tunnel dielectric layer for the first and second emitter regions.

Referring again to FIG. 4A, a dielectric layer 424 is formed above the plurality of N-type doped polysilicon regions 420, the plurality of P-type doped polysilicon regions 422, and the portions of substrate 400 exposed by trenches 416. In one embodiment, a lower surface of the dielectric layer 424 is formed conformal with the plurality of N-type doped polysilicon regions 420, the plurality of P-type doped polysilicon regions 422, and the exposed portions of substrate 400, while an upper surface of dielectric layer 424 is substantially flat, as depicted in FIG. 4A. In a specific embodiment, the dielectric layer 424 is an anti-reflective coating (ARC) layer.

Referring to FIG. 4B, a plurality of contact openings 426 are formed in the dielectric layer 424. The plurality of contact openings 426 provide exposure to the plurality of N-type doped polysilicon regions 420 and to the plurality of P-type doped polysilicon regions 422. In one embodiment, the plurality of contact openings 426 is formed by laser ablation. In one embodiment, the contact openings 426 to the N-type doped polysilicon regions 420 have substantially the same height as the contact openings to the P-type doped polysilicon regions 422, as depicted in FIG. 4B.

Figure 4C:
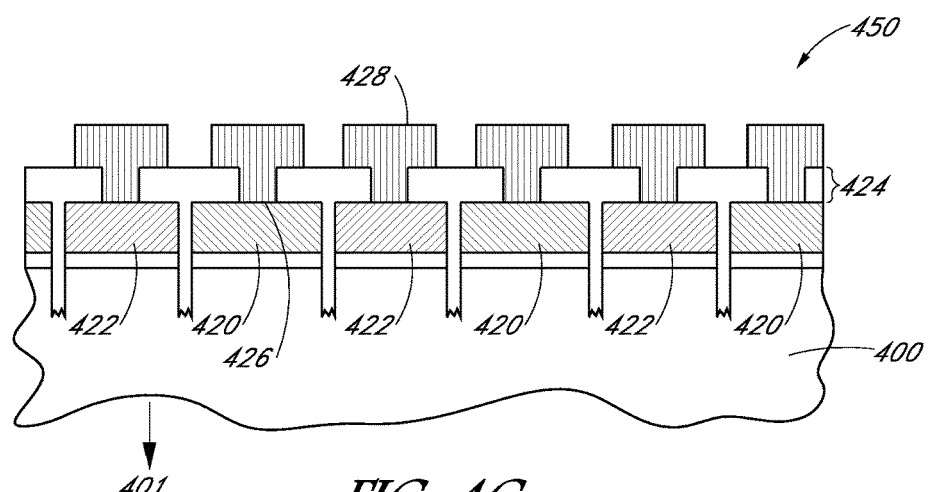

Referring to FIG. 4C, conductive contacts 428 are formed in the plurality of contact openings 426 and coupled to the plurality of N-type doped polysilicon regions 420 and to the plurality of P-type doped polysilicon regions 422. In an embodiment, the conductive contacts 428 are composed of metal and are formed by a deposition, lithographic, and etch approach. Thus, in an embodiment, conductive contacts 428 are formed on or above a surface of a bulk N-type silicon substrate 400 opposing a light receiving surface 401 of the bulk N-type silicon substrate 400. A back contact solar cell 450 is thus fabricated.

Figure 5:
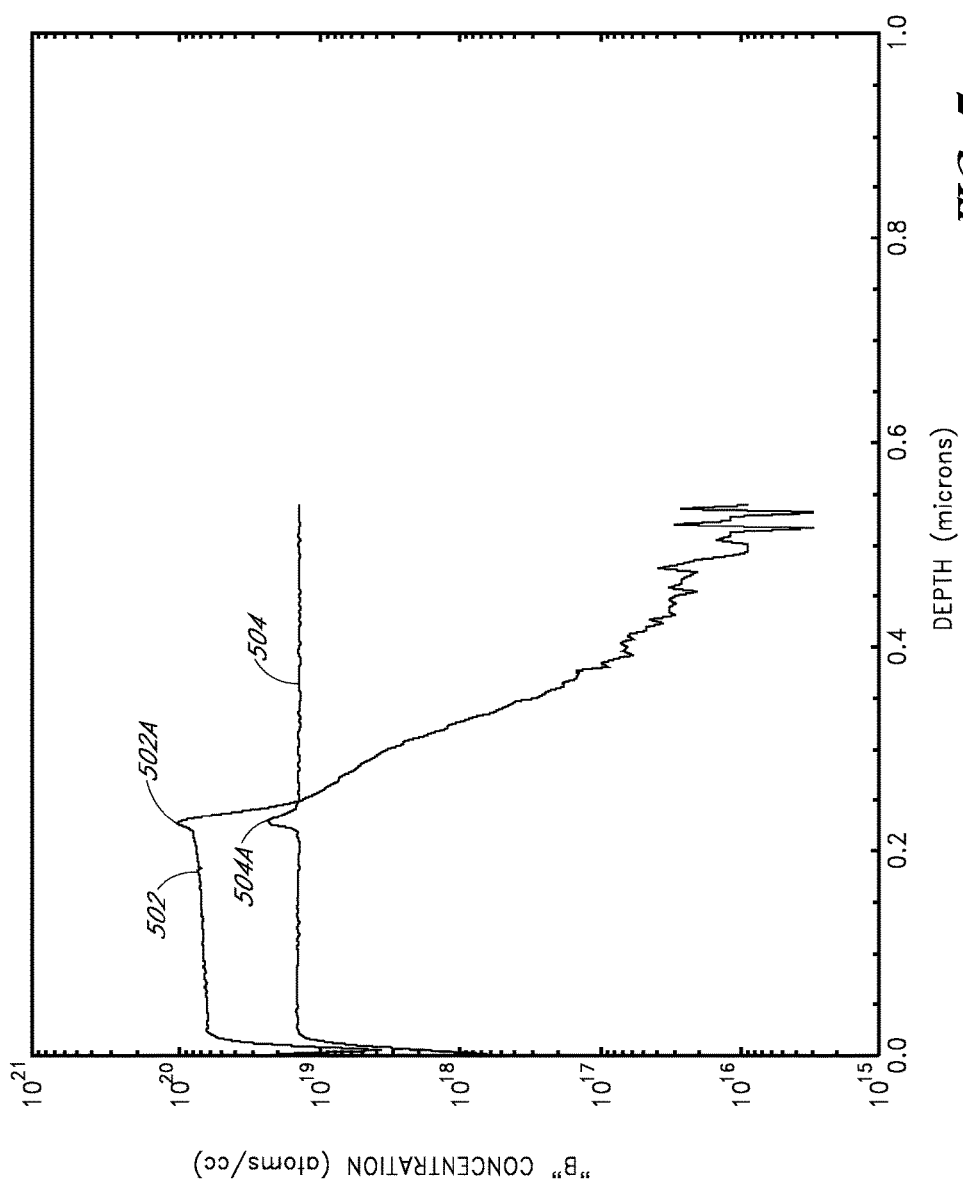
FIG. 5 is a plot of boron (B) concentration (atoms/cm$^3$) as a function of depth (microns) for an emitter region having a silicon oxynitride tunnel dielectric layer versus an emitter region having a silicon oxide tunnel dielectric layer, in accordance with an embodiment of the present invention.

As an example of the boron-inhibiting behavior of a silicon oxynitride tunnel dielectric layer in a solar cell, FIG. 5 is a plot 500 of boron (B) concentration (atoms/cm3) as a function of depth (microns) for an emitter region having a silicon oxynitride tunnel dielectric layer (curve 502) versus an emitter region having a silicon oxide tunnel dielectric layer (curve 504), in accordance with an embodiment of the present invention. Referring to plot 500, for both curves 504 and 502, based on 4.5% boron doping, a boron pile-up occurs in the first portion of the emitter region, up to and including the respective tunnel dielectric layer (at spikes 504A and 502A, respectively). However, in the case of a silicon oxynitride tunnel dielectric layer (curve 502), there is a sharp/steep decline to an approximately 5e16 at/cm$^3$ range (where measurement capability is lost), indicating little to no boron penetration. By contrast, in the case of curve 504, there is no apparent drop off, indicating substantial boron penetration.

More generally, in an embodiment, a silicon oxynitride tunnel dielectric layer is included in a solar cell to block minority carriers. In one embodiment, the thickness of the silicon oxynitride tunnel dielectric layer is approximately in the range of 10-20 Angstroms, and specifically about 15 Angstroms. However, the thermal budget conventionally required to form a tunnel dielectric layer may accelerate the formation of defects in other portions of the solar cell, for example in the substrate of a bulk substrate, back-contact solar cell. Therefore, when applying conventional approaches, there may be a trade-off for the benefits provided by including a tunnel dielectric layer with the damaging effects of the increased thermal budget typically needed to fabricate such a layer. Thus, in accordance with an embodiment of the present invention, approaches provided herein allow for fabrication of a silicon oxynitride tunnel dielectric layer for use in high efficiency solar cell designs, but with a reduced thermal budget. In one embodiment, by reducing the thermal budget, defects otherwise exacerbated with increased thermal exposure are reduced or mitigated.

In an embodiment, then, growth of thin silicon oxynitride for fabricating tunnel dielectric layers in structures with polysilicon contacts is improved in the fabrication of solar cells. For example, improvements may include one or more of the following film attributes: a high performance yet thin silicon oxynitride tunnel dielectric film, controlled thickness, controlled quality, reduced process cycle time, and reduced process thermal budget. In an embodiment, by applying one or more of the approaches described herein, a very thin silicon oxynitride tunnel oxide with good thickness control across a broad substrate is achieved at a relatively low temperature (e.g., reduced thermal budget) and with a relatively short cycle time.

Although certain materials are described specifically above, some materials may be readily substituted with others with other such embodiments remaining within the spirit and scope of embodiments of the present invention. For example, in an embodiment, a different material substrate, such as a group III-V material substrate or a thin film substrate such as one formed from a polycrystalline silicon layer disposed on a global solar cell substrate, can be used instead of a bulk crystalline silicon substrate. In another embodiment, high band gap materials may be used in place of polysilicon to form emitter regions above the solar cell. Furthermore, although described in association with back-contact solar cells, other contact arrangements, such as front-contact solar cells, are considered within the spirit and scope of embodiments of the present invention.

Furthermore, although low-pressure chemical vapor deposition (LPCVD) is provided as a specific example for fabricating a silicon oxynitride tunnel dielectric layer, it is to be understood that other chemical vapor deposition (CVD) process may be used. For example, atmospheric pressure CVD (APCVD), plasma-enhanced CVD (PECVD), thermal growth, or sputtering processes may be used to form such a tunnel dielectric layer.

Thus, solar cells with silicon oxynitride dielectric layers and methods of forming silicon oxynitride dielectric layers for solar cell fabrication have been disclosed. In accordance with an embodiment of the present invention, an emitter region of a solar cell includes a portion of a substrate having a back surface opposite a light receiving surface. A silicon oxynitride ($SiO_xN_y$, 0<x, y) dielectric layer is disposed on the back surface of the portion of the substrate. A semiconductor layer is disposed on the silicon oxynitride dielectric layer. In one embodiment, the silicon oxynitride dielectric layer has only one nitrogen concentration maxima, the maxima at a surface of the silicon oxynitride dielectric layer proximate to the back surface of the portion of the substrate. In one embodiment, the silicon oxynitride dielectric layer has only one nitrogen concentration maxima, the maxima at a surface of the silicon oxynitride dielectric layer distal from the back surface of the portion of the substrate. In one embodiment, the silicon oxynitride dielectric layer has two nitrogen concentration maxima, one maxima at a surface of the silicon oxynitride dielectric layer distal from the back surface of the portion of the substrate, and one maxima at a surface of the silicon oxynitride dielectric layer proximate to the back surface of the portion of the substrate.

What is claimed is:

1. An emitter region of a solar cell, the emitter region comprising:
    a portion of a substrate having a back surface opposite a front surface;
    a silicon oxynitride (SiOxNy, 0<x, y) dielectric layer disposed on the back surface of the portion of the substrate, wherein the silicon oxynitride dielectric layer has a non-homogeneous distribution of nitrogen, wherein the silicon oxynitride dielectric layer has only one nitrogen concentration maxima, wherein a concentration of nitrogen at the maxima is 2-5% and equal to or greater than twice the a nitrogen concentration in another portion of the silicon oxynitride dielectric layer is 0-1%, and wherein the silicon oxynitride dielectric layer is a silicon oxynitride tunnel dielectric layer for the emitter region, wherein the silicon oxynitride dielectric layer has a first surface in contact with the back surface of the portion of the substrate, and a second surface opposite the first surface, and wherein the maxima is at the first surface of the silicon oxynitride dielectric layer; and
    a semiconductor layer disposed on the silicon oxynitride dielectric layer.

2. The emitter region of claim 1, wherein the front surface is a light receiving surface of the solar cell.

3. The emitter region of claim 1, wherein the silicon oxynitride dielectric layer has a thickness approximately in the range of 10-20 Angstroms.

4. The emitter region of claim 1, wherein the silicon oxynitride dielectric layer has a composition wherein x>y.

5. The emitter region of claim 1, wherein the semiconductor layer disposed on the silicon oxynitride dielectric layer is a boron-doped silicon layer, and wherein the silicon oxynitride dielectric layer comprises boron atoms.

6. An emitter region of a solar cell, the emitter region comprising:
    a portion of a substrate having a back surface opposite a front surface;
    a silicon oxynitride (SiOxNy, 0<x, y) dielectric layer disposed on the back surface of the portion of the substrate, wherein the silicon oxynitride dielectric layer has a non-homogeneous distribution of nitrogen, wherein the silicon oxynitride dielectric layer has only one nitrogen concentration maxima, wherein a concentration of nitrogen at the maxima is 2-5% and equal to or greater than twice the a nitrogen concentration in another portion of the silicon oxynitride dielectric layer is 0-1%, and wherein the silicon oxynitride dielectric layer is a silicon oxynitride tunnel dielectric layer for the emitter region, wherein the silicon oxynitride dielectric layer has a first surface in contact with the back surface of the portion of the substrate, and a second surface opposite the first surface, wherein the maxima is at the first surface of the silicon oxynitride dielectric layer, wherein the silicon oxynitride dielectric layer has a thickness approximately in the range of 10-20 Angstroms, and wherein the silicon oxynitride dielectric layer has a composition wherein x>y; and a semiconductor layer disposed on the silicon oxynitride dielectric layer.

7. The emitter region of claim 6, wherein the front surface is a light receiving surface of the solar cell.

8. The emitter region of claim 6, wherein the semiconductor layer disposed on the silicon oxynitride dielectric layer is a boron-doped silicon layer, and wherein the silicon oxynitride dielectric layer comprises boron atoms.

9. An emitter region of a solar cell, the emitter region comprising:

a portion of a substrate having a back surface opposite a front surface;

a silicon oxynitride ($SiO_xN_y$, $0<x, y$) dielectric layer disposed on the back surface of the portion of the substrate, wherein the silicon oxynitride dielectric layer has a non-homogeneous distribution of nitrogen, wherein the silicon oxynitride dielectric layer has only one nitrogen concentration maxima, wherein a concentration of nitrogen at the maxima is 2-5% and equal to or greater than twice the a nitrogen concentration in another portion of the silicon oxynitride dielectric layer is 0-1%, and wherein the silicon oxynitride dielectric layer is a silicon oxynitride tunnel dielectric layer for the emitter region, wherein the silicon oxynitride dielectric layer has a first surface in contact with the back surface of the portion of the substrate, and a second surface opposite the first surface, wherein the maxima is at the first surface of the silicon oxynitride dielectric layer, and wherein the silicon oxynitride dielectric layer has a composition wherein x>y; and a semiconductor layer disposed on the silicon oxynitride dielectric layer, wherein the semiconductor layer disposed on the silicon oxynitride dielectric layer is a boron-doped silicon layer, and wherein the silicon oxynitride dielectric layer comprises boron atoms.

10. The emitter region of claim 9, wherein the front surface is a light receiving surface of the solar cell.

11. The emitter region of claim 9, wherein the silicon oxynitride dielectric layer has a thickness approximately in the range of 10-20 Angstroms.

* * * * *